United States Patent [19]
Minamizaki

[11] Patent Number: 5,396,123
[45] Date of Patent: Mar. 7, 1995

[54] OFFSET DETECTING CIRCUIT AND OUTPUT CIRCUIT AND INTEGRATED CIRCUIT INCLUDING THE OUTPUT CIRCUIT

[75] Inventor: Hironori Minamizaki, Kawasaki, Japan

[73] Assignee: Kabushiki Kaisha Toshiba, Kawasaki, Japan

[21] Appl. No.: 5,138

[22] Filed: Jan. 15, 1993

[30] Foreign Application Priority Data

Jan. 16, 1992 [JP] Japan .................. 4-005858

[51] Int. Cl.⁶ .............................. H03K 5/159
[52] U.S. Cl. ........................ 327/94; 327/307
[58] Field of Search ........ 307/491, 493, 494, 353, 307/354, 296.1, 296.4; 345/98, 100; 359/85

[56] References Cited
FOREIGN PATENT DOCUMENTS 0152098  6/1990  Japan .................. 307/353

Primary Examiner—William L. Sikes
Assistant Examiner—James Dudek
Attorney, Agent, or Firm—Foley & Lardner

[57] ABSTRACT

An offset detecting circuit 10 includes: a sample hold circuit 12 for holding a reference voltage Vref; and a buffer amplifier 13 having two pairs of input terminals. The reference voltage Vref is applied to at least one input terminal of one pair of the two input terminal pairs, and an output signal of the sample hold circuit 12 and an output signal VDout of the buffer amplifier 13 are applied to the other pair of the two input terminal pairs of the buffer amplifier 13, respectively. Further, an output circuit is composed of this offset detecting circuit 10 and a signal voltage outputting circuit 20 configured in the same way as the offset detecting circuit 10. The signal voltage outputting circuit 20 corrects the offset of a signal Vin inputted thereto on the basis of an offset voltage V between the reference voltage Vref and the output voltage VDout supplied from the offset voltage detecting circuit 10. The offset detecting circuit 10 and the signal voltage outputting circuits 20 can be integrated on the same substrate or on different substrates, separately as occasion demands.

11 Claims, 7 Drawing Sheets

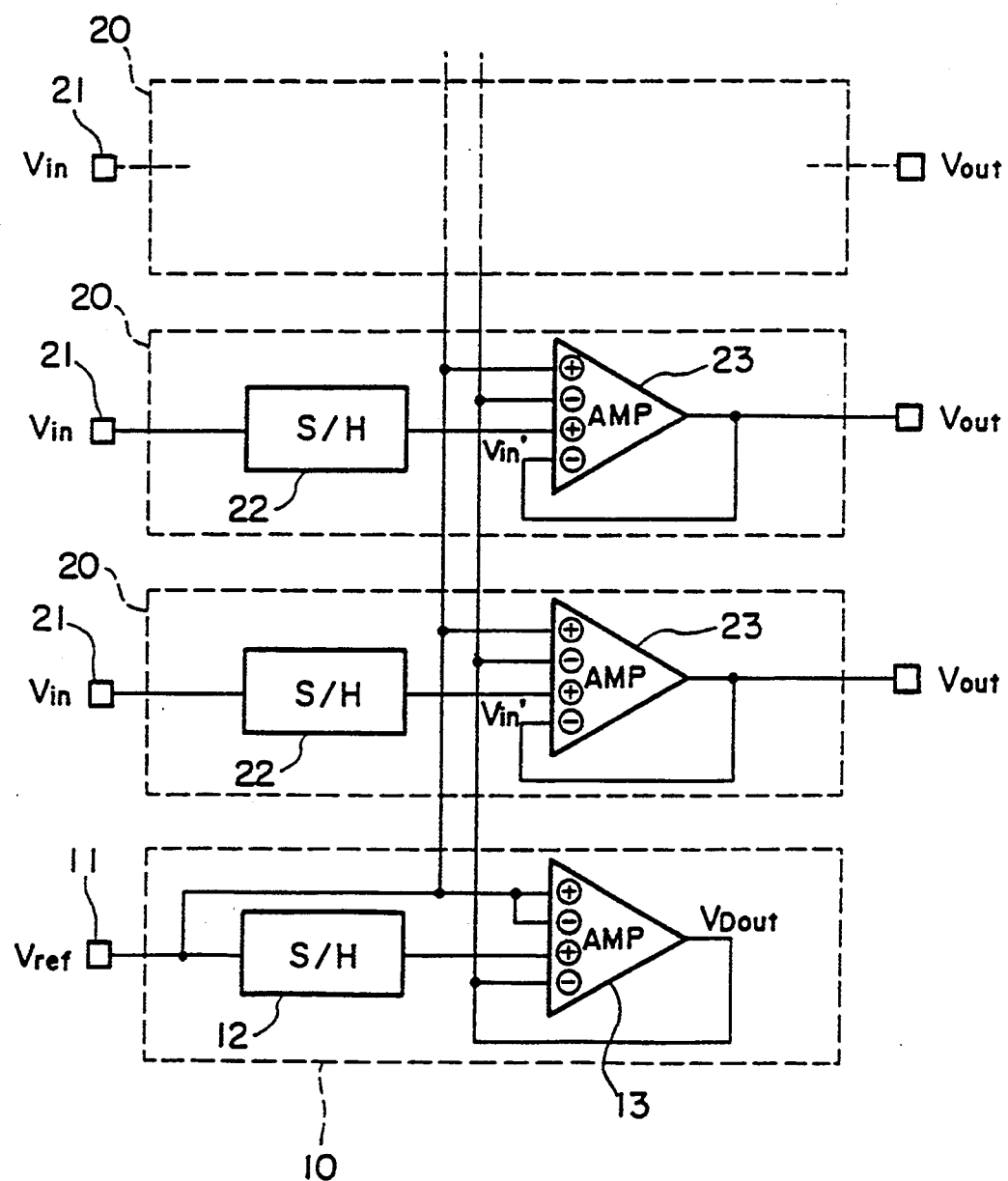
F I G. 1

OFFSET DETECTING CIRCUIT AND OUTPUT CIRCUIT AND INTEGRATED CIRCUIT INCLUDING THE OUTPUT CIRCUIT

BACKGROUND OF THE INVENTION

1. Field of the Invention

The present invention relates to an offset detecting circuit for detecting an offset voltage and an output circuit for correcting the offset voltage, and a semiconductor integrated circuit including the output circuit.

2. Description of the Prior Art

A conventional output circuit will be explained with respect to its application to a driving integrated circuit (referred to as IC, hereinafter) incorporated in a liquid crystal display panel, with reference to FIG. 7.

As shown in FIG. 7, the conventional output circuit 60 comprises a sample and hold circuit 62 for holding a potential level of a voltage signal received through an input terminal 61 and outputting the held voltage signal, and an operational amplifier 63 for receiving the output of the sample and hold circuit 62 and outputting the amplified voltage through an output terminal 67. The operational amplifier 63 is a voltage follower circuit such that the output of the sample and hold circuit 62 is received through a non-inversion input terminal 64 thereof and an output side 66 thereof is connected to an inversion terminal 65 thereof.

The output circuit 60 as described above is connected to each line of drive lines of a liquid crystal display panel in order to apply a driving voltage to each drive line.

In general, a single driving IC includes several output circuits, and a plurality of driving ICs are required to drive a single liquid crystal display panel.

In the output circuit as described above, since the voltage level of a voltage signal inputted through the input terminal 61 usually fluctuates in the sample and hold circuit 62 and the operational amplifier 63, a voltage signal outputted through the output terminal 67 usually includes a constant error (e.g. an offset) voltage $\Delta V$ with respect to the voltage signal inputted through the input terminal 61.

The offset voltage $\Delta V$ differs according to the respective output circuits provided in the same driving IC, and in particular the dispersion is relatively large according to the respective driving ICs.

Accordingly, when the liquid crystal display panel is driven by use of a plurality of driving ICs, the driving voltages applied to the respective operation lines of the liquid crystal display panel differ, thus resulting in a problem in that the brightness on the picture plane of the liquid crystal display panel is not uniform.

SUMMARY OF THE INVENTION

With these problems in mind, it is therefore a first object of the present invention to provide an offset voltage detecting circuit which can detect an offset voltage appropriately.

A second object of the present invention is to provide an output circuit which can output a stable voltage signal without any offset voltage and therefore without any voltage dispersion.

A third object of the present invention is to provide a semiconductor integrated circuit including the output circuit as described above.

According to one aspect of the present invention, there is provided an offset detecting circuit, comprising:
 a sample and hold circuit for receiving and holding a reference voltage; and
 a buffer amplifier having two pairs of input terminals, the reference voltage being applied to at least one input terminal of one pair of the two input terminal pairs, and an output signal of said sample and hold circuit and an output signal of said buffer amplifier being applied to two input terminals of the other pair of the two input terminal pairs, respectively.

According to another aspect of the present invention, there is provided an output circuit, comprising:
 an offset detecting circuit having:
  a first sample and hold circuit for receiving and holding a reference voltage inputted thereto; and
  a first buffer amplifier for outputting a voltage signal inputted thereto by said first sample and hold circuit; and
 a signal voltage outputting circuit having:
  a second sample and hold circuit for holding a signal voltage inputted thereto;
  offset detecting means for detecting a potential difference between the reference voltage and a signal voltage outputted by said offset detecting circuit;
  correcting means for correcting a signal voltage inputted by said second sample and hold circuit on the basis of an offset voltage inputted by said offset detecting means; and
  outputting means for outputting a signal voltage corrected by said correcting means.

According to further aspect of the present invention there is provided a semiconductor integrated circuit, wherein there are integrated:
 an offset detecting circuit having:
  a first sample and hold circuit for receiving and holding a reference voltage inputted thereto; and
  a first buffer amplifier for outputting a voltage signal inputted thereto by said first sample and hold circuit; and
 a signal voltage outputting circuit having:
  a second sample and hold circuit for holding a signal voltage inputted thereto;
  offset detecting means for detecting a potential difference between the reference voltage and a signal voltage outputted by said offset detecting circuit;
  correcting means for correcting a signal voltage inputted by said second sample and hold circuit on the basis of an offset voltage inputted by said offset detecting means; and
  outputting means for outputting a signal voltage corrected by said correcting means.

In the offset detecting circuit according to the present invention, a reference voltage is sampled and held by a sample and hold circuit; and a buffer amplifier outputs an offset voltage on the basis of the reference voltage and the sampled reference voltage.

Further, in the output circuit, an offset voltage is detected by comparison between the reference voltage and the output voltage of the offset voltage detecting circuit; an output signal voltage of a signal voltage outputting circuit is corrected on the basis of the detected offset voltage so that the offset voltage of this output signal voltage can be reduced substantially down to zero.

The offset detecting circuit and the signal voltage outputting circuits can be integrated appropriately. That is, a single offset detecting circuit and a predetermined number of signal voltage outputting circuits are integrated together. Alternatively, only the signal voltage outputting circuits can be integrated.

BRIEF DESCRIPTION OF THE DRAWINGS

FIG. 1 is a block diagram showing an embodiment of the output circuit according to the present invention;

DETAILED DESCRIPTION OF THE PREFERRED EMBODIMENTS

Figure 2:
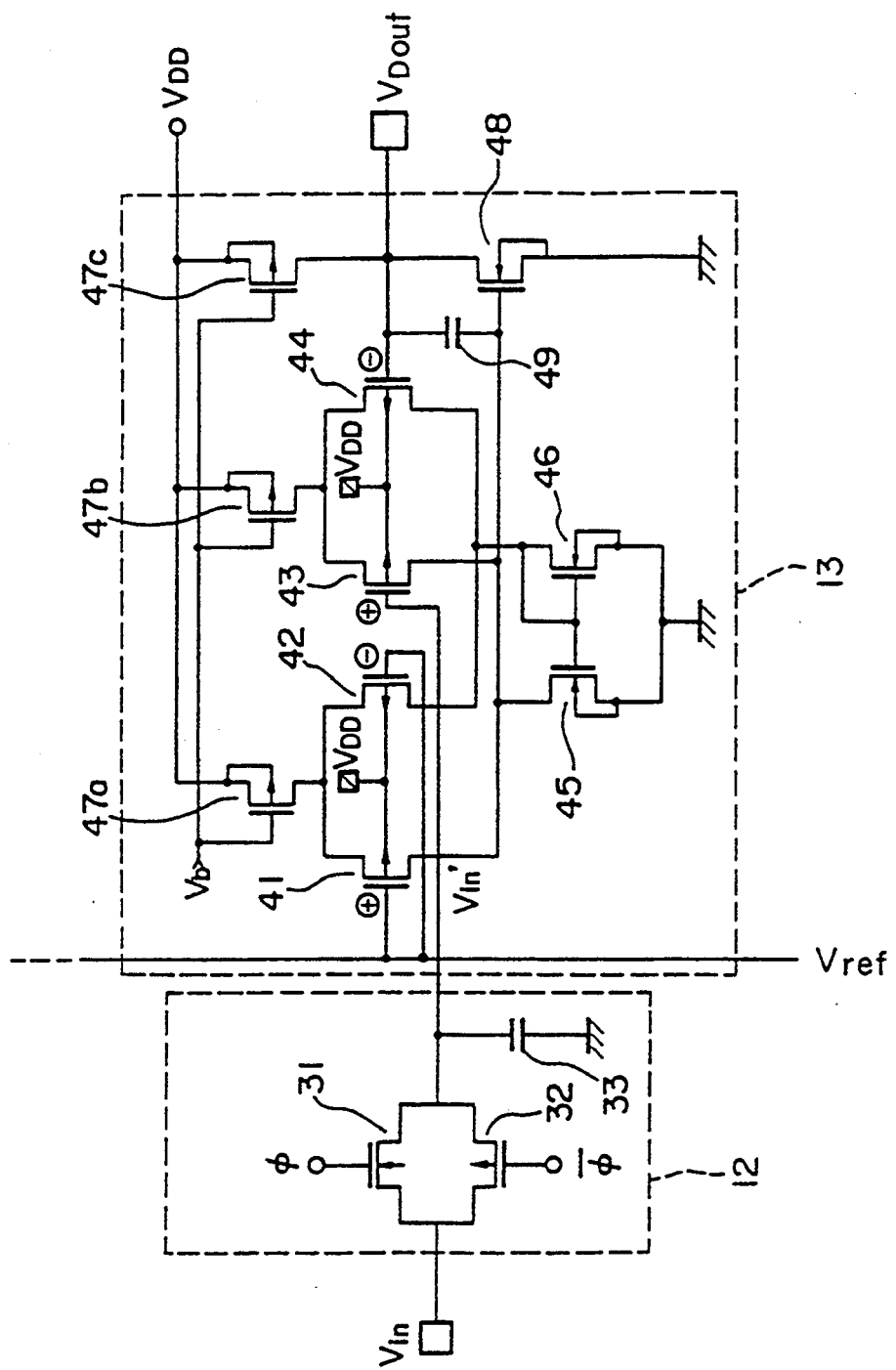
FIG. 2 is a circuit diagram showing a configuration of the offset detecting circuit shown in FIG. 1.

The embodiments of the present invention will be described hereinbelow with reference to the attached drawings.

FIG. 1 is a circuit diagram showing a driving IC (integrated circuit) including an output circuit related to one embodiment of the present invention.

In FIG. 1, the driving IC comprises an offset detecting circuit 10 for detecting an offset voltage and a plurality of signal voltage outputting circuits 20 for outputting a plurality of signal voltages, respectively. The offset detecting circuit 10 comprises a sample and hold circuit 12 and a buffer amplifier 13. A reference voltage signal Vref inputted through an input terminal 11 is applied to the sample and hold circuit 12. The output of the sample and hold circuit 12 is inputted to the buffer amplifier 13. The buffer amplifier 13 is provided with two pairs of input terminals. The reference voltage signal Vref is inputted to the first input terminal pair; and the output signal of the sample and hold circuit 12 is inputted to a non-inversion input terminal of the second input terminal pair, and an output voltage VDout of the buffer amplifier 13 itself is inputted to an inversion input terminal of the second input terminal pair. The reference signal voltage Vref and the output voltage VDout are both given to a plurality of signal voltage outputting circuits 20, respectively.

Each signal voltage outputting circuit 20 includes a sample and hold circuit 22 and a buffer amplifier 23. A voltage Vin is inputted through an input terminal 21 of the sample and hold circuit 22. The inputted voltage Vin is held in the sampled status by the sample and hold circuit 22 and then outputted as an input signal Vin' to the buffer amplifier 23. The buffer amplifier 23 is also provided with two pairs of input terminals. The reference signal voltage Vref received through the input terminal 11 of the offset detecting circuit 10 is inputted to a non-inversion input terminal of the first input terminal pair; and the output voltage VDout of the buffer amplifier 13 of the offset detecting circuit 10 is inputted to an inversion input terminal of the first input terminal pair. Further, the input signal Vin' is inputted to a non-inversion input terminal of the second input terminal pair; and an output voltage of the buffer amplifier itself 23 is inputted to an inversion input terminal of the second input terminal pair. Accordingly, a potential difference (i.e. offset voltage) $\Delta V$ between the output voltage VDout and the reference voltage Vref is first detected by the offset detecting circuit 10, and thereafter the offset voltage is corrected on the basis of the detected offset voltage $\Delta V$.

FIG. 2 shows the circuit configuration of the offset detecting circuit 10.

The voltage signal Vin inputted to the sample and hold circuit 12 is sampled by two complemental MOS transistors 31 and 32 which constitute a transfer gate in response to gate input signals $\Phi$ and $\overline{\Phi}$. Furthermore, the sampled signal is held by a capacitor 33, and then outputted.

The buffer amplifier 13 is composed of two pairs of two common source MOS structure field effect transistors (referred to as FETs, hereinafter) 41, 42, 43 and 44, to all the sources of which a voltage VDD is supplied. The reference voltage Vref is given to gates of the FETs 41 and 42; the output signal of the sample and hold circuit 12 is applied to a gate of the FET 43; and the output voltage VDout of the buffer amplifier 13 itself can be taken from a gate of the FET 44.

Furthermore, a current mirror circuit is composed of two FETs 45 and 46. Drain currents of the FETs 41 and 43 are supplied to a source of the FET 45; and drain currents of the FETs 42 and 44 are supplied to a source of the FET 46, respectively. Therefore, it is possible to obtain an output voltage VDout indicative of a difference between an addition of drain currents of the FETs 41 and 43 and an addition of drain currents of the FETs 42 and 44.

Furthermore, FETs 47a to 47c constitute a constant current supply; and an FET 48 and a capacitor 49 constitute a signal outputting circuit.

By use of the offset voltage detecting circuit as described above, it is possible to detect the offset voltage $\Delta V$ at high accuracy.

Figure 3:
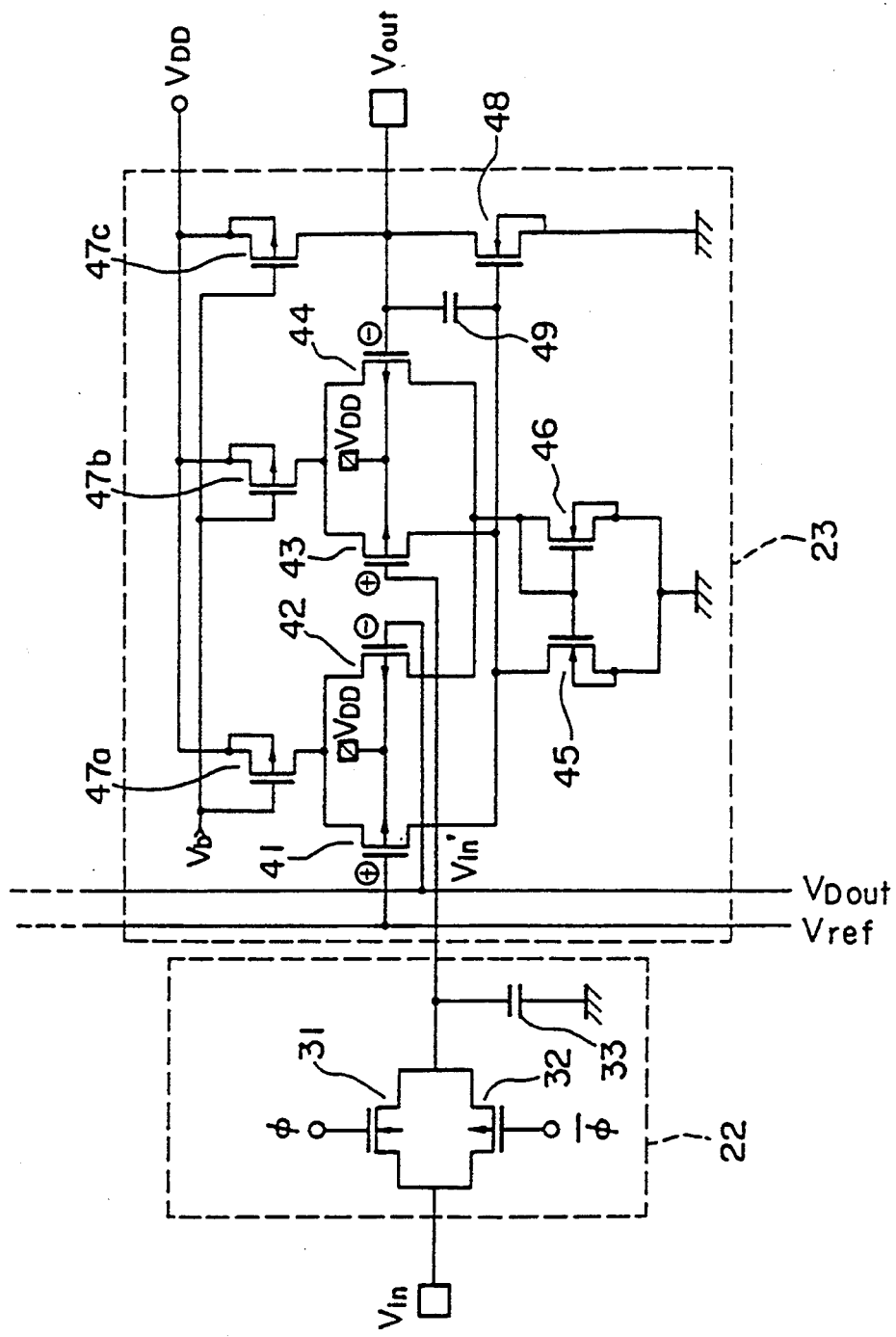
FIG. 3 is a circuit diagram showing a configuration of the signal voltage outputting circuit shown in FIG. 1.

FIG. 3 shows a circuit configuration of the signal voltage outputting circuit 20 for outputting signal voltage. Since this circuit is similar to the circuit shown in FIG. 2, the same reference numerals have been retained for similar parts which have the same functions, without repeating any detailed description thereof. The points different between the offset detecting circuit shown in FIG. 2 and the signal voltage outputting circuit shown in FIG. 3 are that in FIG. 3, the output voltage VDout of the offset detecting circuit 10 is given to the gate of the FET 42 and further the gate of the FET 44 becomes the output terminal Vout.

According to the buffer amplifier 23 shown in FIG. 3, it is possible to output the voltage obtained by subtracting the offset voltage $\Delta V$ from the ordinary voltage follower circuit (see FIG. 6), that is, the output voltage Vout is made equal to the input voltage Vin.

Care should be taken that the circuit configurations of the sample and hold circuits 12 and 22 and the buffer amplifiers 13 and 23 are not limited to only those shown in FIGS. 2 and 3.

Figure 4:
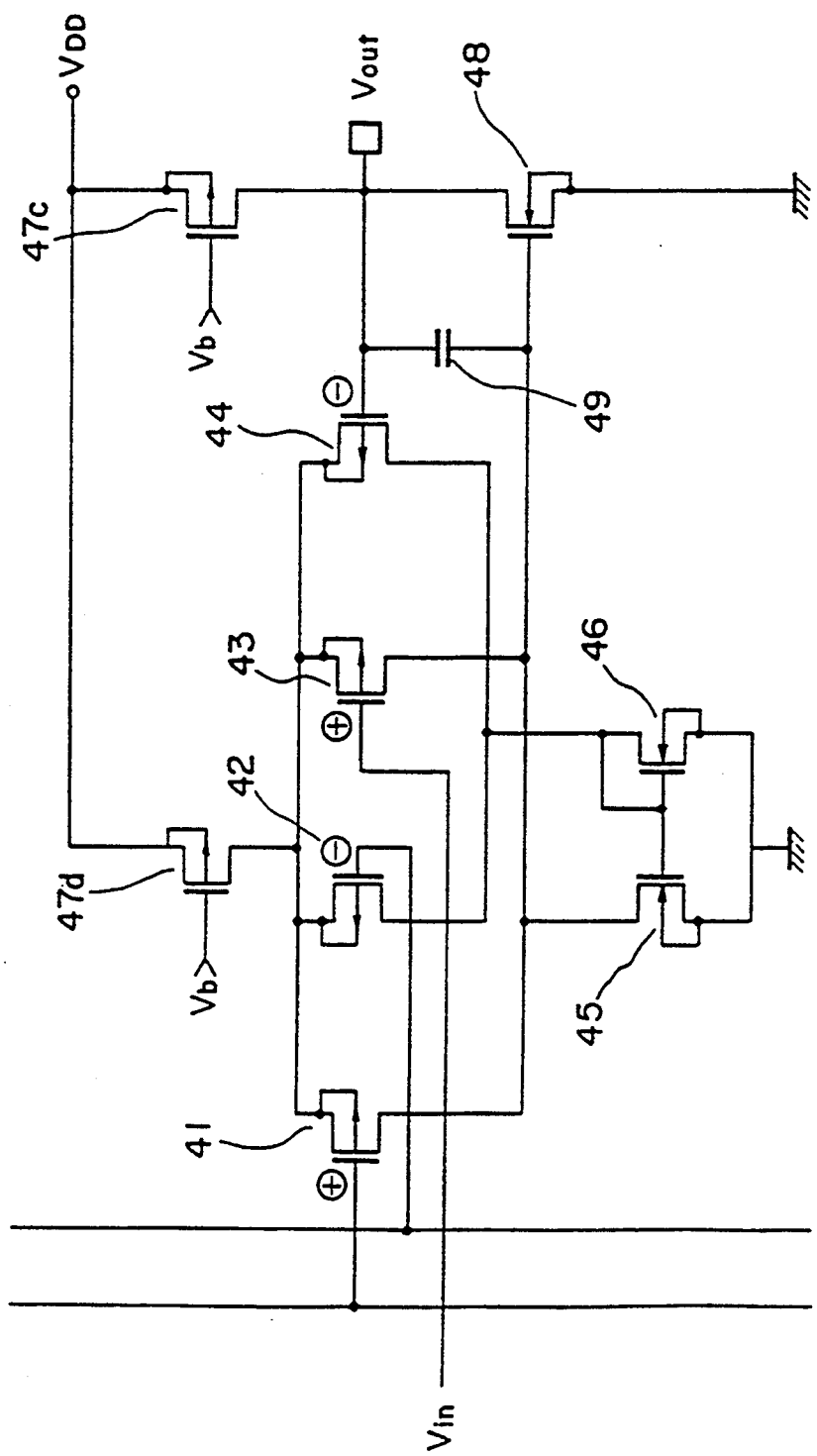
FIG. 4 is a circuit diagram showing a modified embodiment of the signal voltage outputting circuit shown in FIG. 1.

For instance, the buffer amplifiers 13 and 23 shown in FIGS. 2 and 3 can be modified as shown in FIG. 4, in which the two FETs 47a and 47b which function as constant current sources are replaced with a single FET 47d. This modification can simplify the circuit configuration and therefore it is possible to suppress the dispersion of characteristics between the two input pairs.

Figure 5:
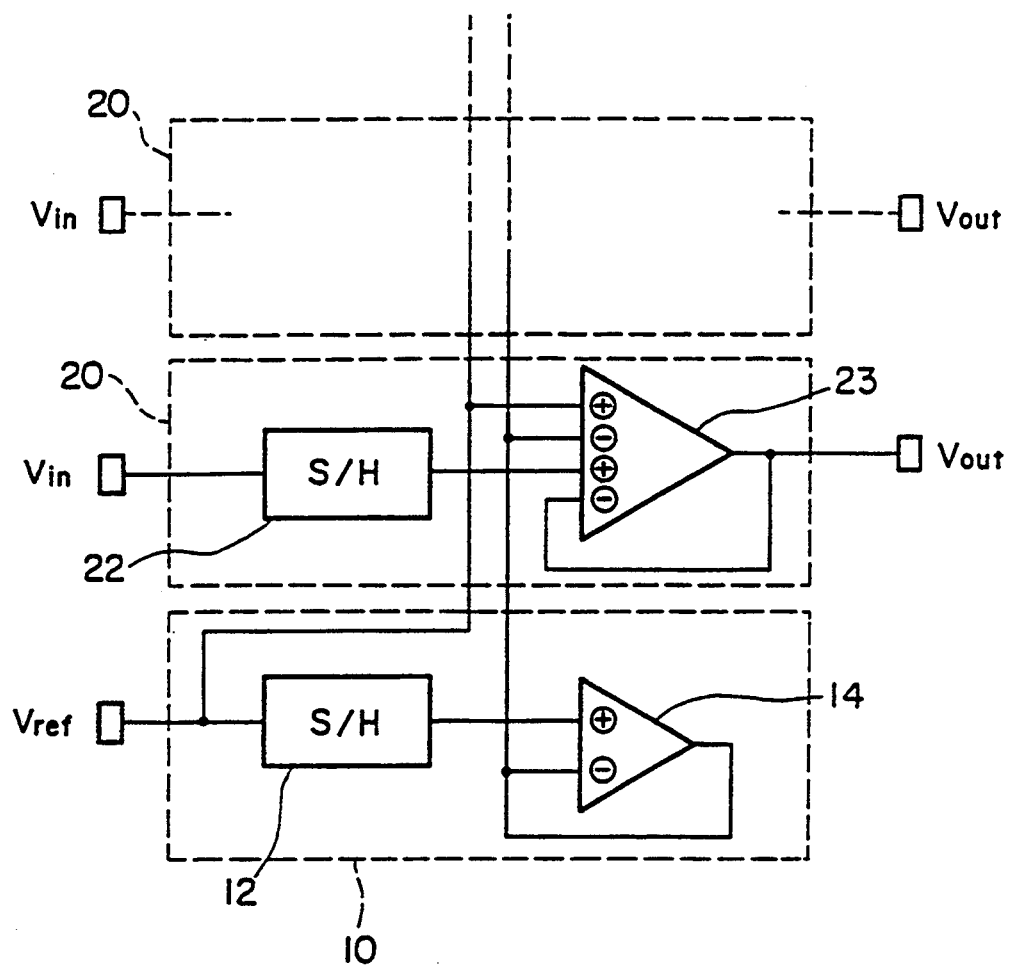
FIG. 5 is a block diagram showing another modified embodiment of the output circuit shown in FIG. 1.

Furthermore, in the case where it is unnecessary to detect the offset voltage ΔV at high precision, it is possible to use a voltage follower circuit 14 using an ordinary operational amplifier as shown in FIG. 5, instead of the buffer amplifier 13. In this circuit configuration, the circuit can be also simplified.

Still further, it is possible to provide the offset detecting circuit one by one for a predetermined number of output circuits. For instance, when the number of output circuits is 100, one offset detecting circuit can be provided for every ten output circuits.

Another embodiment of the present invention will be described hereinbelow with reference to FIG. 6.

Figure 6:
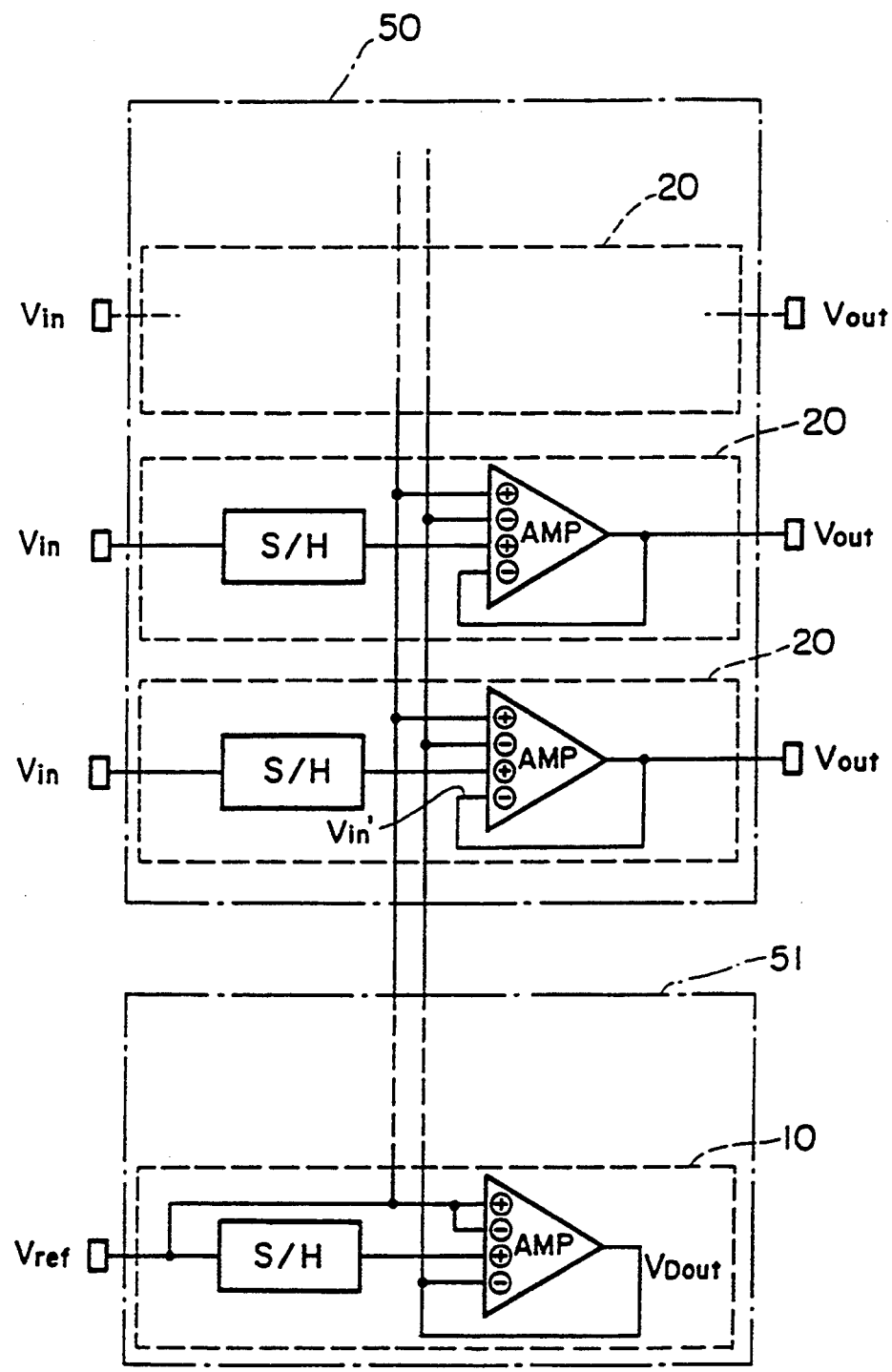
FIG. 6 is a block diagram showing another embodiment in which the offset detecting circuit and the output circuit are integrated as two different ICs, separately.
Figure 7:
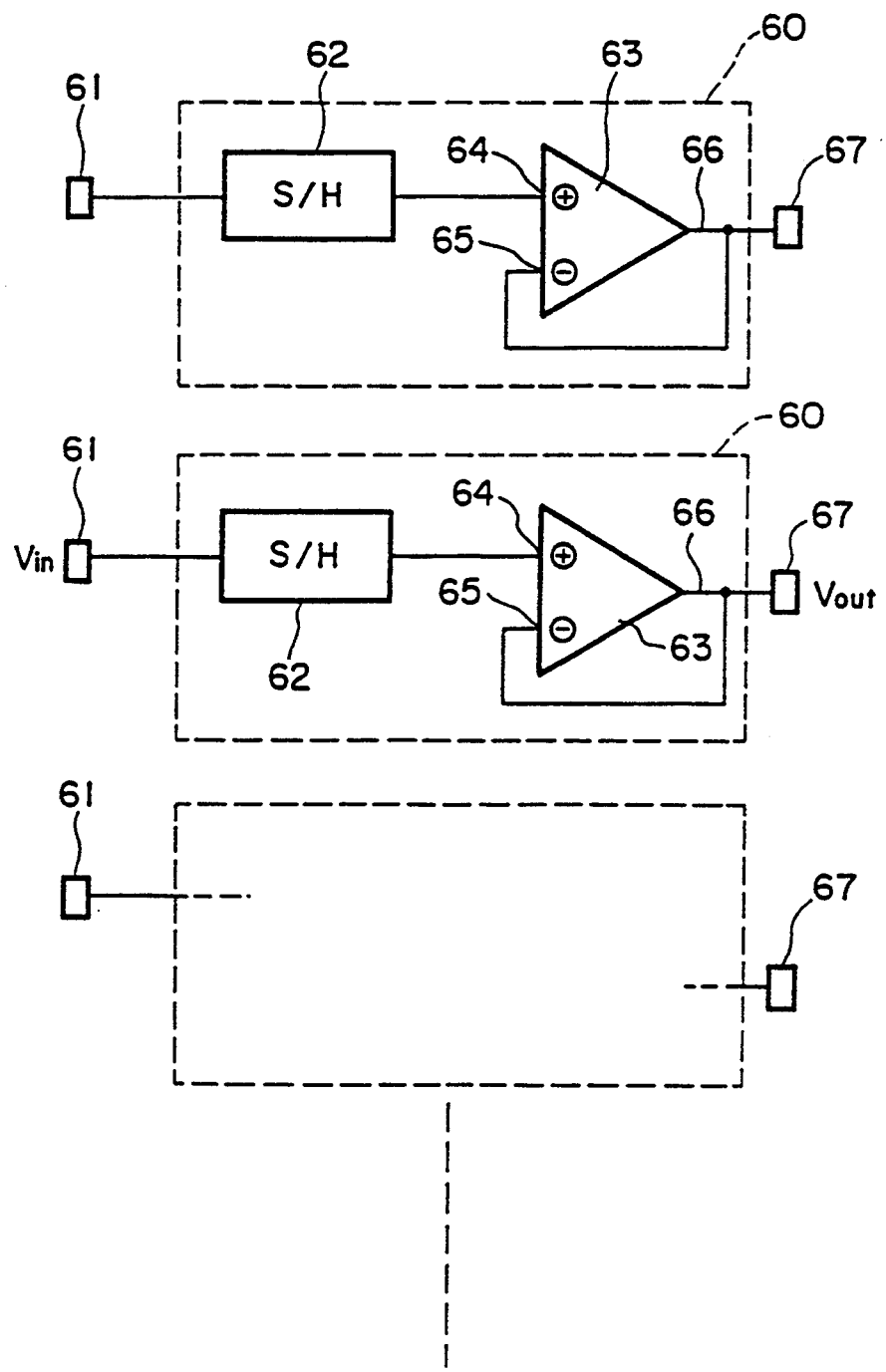
FIG. 7 is a block diagram showing an example of a conventional output circuit.

In FIG. 6, the driving IC 50 of the present embodiment includes only the signal voltage outputting circuits 20 for outputting a signal voltage, respectively, without including the offset detecting circuit 10. In this embodiment, the reference voltage Vref and the output voltage VDout are inputted through another driving IC 51 (see FIG. 1) having the offset detecting circuit 10, in order to correct the offset voltage as with the case of the above-mentioned embodiment shown in FIG. 1.

As described above, in this embodiment, since the driving IC 50 includes the output circuit having only the signal voltage outputting circuits 20 without having any offset detecting circuit 10 and since the reference voltage Vref and the output voltage VDout are both obtained through another driving IC 51, where a plurality of driving ICs are used simultaneously, it is possible to reduce the total cost of the circuit configuration.

In particular, where the offset voltage ΔV is low among driving ICs, it is advantageous to use the driving IC 50 of this embodiment.

For instance, where a single liquid crystal display panel is driven by a plurality of driving ICs, it is possible to use a single driving IC 51 of the afore-mentioned embodiment as shown in FIG. 1 and a plurality of driving ICs 50 of this embodiment as shown in FIG. 6 (as the other remaining driving ICs), thus the cost required for controlling the liquid crystal display panel can be reduced markedly.

What is claimed is:

1. An offset detecting circuit, comprising:
   a reference voltage input terminal for receiving a reference voltage;
   a sample and hold circuit for holding said reference voltage received by said reference voltage input terminal;
   a buffer amplifier having a first pair of input terminals including a first non-inversion input terminal and a first inversion input terminal and a second pair of input terminals including a second non-inversion input terminal and a second inversion input terminal, said reference voltage terminal being connected to at least one of said first pair of input terminals, and an output signal of said sample and hold circuit being applied to said second non-inversion input terminal and an output signal of said buffer amplifier being applied to said second inversion input terminal of said second pair of input terminals, respectively, wherein
   a total offset due to said sample and hold circuit and said buffer amplifier appears across said second inversion input terminal of said second pair of input terminals.

2. The offset detecting circuit according to claim 1, wherein said reference voltage is applied to both said first non-inversion input terminal and said first inversion input terminal.

3. The offset detecting circuit according to claim 1, wherein said buffer amplifier has two pairs of transistors which are connected to a common current source.

4. An output circuit, comprising:
   an offset detecting circuit, comprising:
      a reference voltage input terminal for receiving a reference voltage;
      a first sample and hold circuit for holding said reference voltage received by said reference voltage input terminal;
      a first buffer amplifier having a first pair of input terminals including a first non-inversion input terminal and a first inversion input terminal and a second pair of input terminals including a second non-inversion input terminal and a second inversion input terminal, said reference voltage terminal being connected to at least one of said first pair of input terminals, and an output signal of said first sample and hold circuit being applied to said second non-inversion input terminal of said second pair of input terminals; and
   a signal voltage outputting circuit, comprising:
      a second sample and hold circuit for holding a signal voltage inputted thereto;
      a second buffer amplifier having a third pair of input terminals including a third non-inversion input terminal and a third inversion input terminal and a fourth pair of input terminals including a fourth non-inversion input terminal and a fourth inversion input terminal, said third non-inversion input terminal being connected to said reference voltage input terminal, said third inversion terminal being connected to said second inversion terminal, output signal of said second sample and hold circuit being applied to said fourth non-inversion input terminal and an output signal of said second buffer amplifier being applied to said fourth inversion input terminal and to a signal output terminal, wherein said second buffer amplifier outputs a signal whereby a total offset of said second sample and hold circuit and of said second buffer amplifier are canceled.

5. The output circuit according to claim 4, further comprising a predetermined number of said signal voltage outputting circuits, wherein said offset detecting circuit is commonly provided for said signal voltage outputting circuits.

6. The output circuit according to claim 4, wherein said first and second buffer amplifier each have two pairs of transistors which are connected to a common current source.

7. The output circuit according to claim 4, wherein said reference voltage is applied to both said first non-inversion input terminal and said first inversion input terminal.

8. A semiconductor integrated circuit, comprising:
   an offset detecting circuit, comprising:
      a reference voltage input terminal for receiving a reference voltage;
      a first sample and hold circuit for holding said reference voltage received by said reference voltage input terminal;
      a first buffer amplifier having a first pair of input terminals including a first non-inversion input terminal and a first inversion input terminal and a second pair of input terminals including a second non-inversion input terminal and a second inversion input terminal, said reference voltage terminal being connected to at least one of said first pair of input terminals, and an output signal of said first sample and hold circuit being applied to said second non-inversion input terminal of said second pair of input terminals; and a signal voltage outputting circuit, comprising:
- a second sample and hold circuit for holding a signal voltage inputted thereto;
- a second buffer amplifier having a third pair of input terminals including a third non-inversion input terminal and a third inversion input terminal and a fourth pair of input terminals including a fourth non-inversion input terminal and a fourth inversion input terminal, said third non-inversion input terminal being connected to said reference voltage input terminal, said third inversion terminal being connected to said second inversion input terminal, and an output signal of said second sample and hold circuit being applied to said fourth non-inversion input terminal and an output signal of said second buffer amplifier being applied to said fourth inversion input terminal and to a signal output terminal, wherein said second buffer amplifier outputs a signal whereby a total offset of said second sample and hold circuit and of said second buffer amplifier are canceled.

9. The semiconductor integrated circuit according to claim 8, wherein said offset detecting circuit and a plurality of said signal voltage outputting circuits are integrated on a same substrate.

10. The semiconductor integrated circuit according to claim 8, wherein said offset detecting circuit and a plurality of said signal voltage outputting circuits are separately integrated on different substrates.

11. The semiconductor integrated circuit according to claim 8, wherein said reference voltage is applied to both said first non-inversion input terminal and said first inversion input terminal.

* * * * *